(12) United States Patent
Akiyama et al.

(10) Patent No.: US 8,563,401 B2
(45) Date of Patent: Oct. 22, 2013

(54) METHOD FOR FABRICATING SOI SUBSTRATE

(75) Inventors: Shoji Akiyama, Annaka (JP); Atsuo Ito, Tokyo (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 13/127,257

(22) PCT Filed: Nov. 11, 2009

(86) PCT No.: PCT/JP2009/069208
§ 371 (c)(1),
(2), (4) Date: Jun. 21, 2011

(87) PCT Pub. No.: WO2010/055857
PCT Pub. Date: May 20, 2010

(65) Prior Publication Data
US 2011/0244655 A1 Oct. 6, 2011

(30) Foreign Application Priority Data

Nov. 12, 2008 (JP) .................................. 2008-290287
Nov. 10, 2009 (JP) .................................. 2009-256854

(51) Int. Cl.
*H01L 21/30* (2006.01)
*H01L 21/46* (2006.01)

(52) U.S. Cl.
USPC ..................................... 438/458; 257/E21.32

(58) Field of Classification Search
USPC ..................................... 438/458; 257/E21.32
See application file for complete search history.

(56) References Cited

U.S. PATENT DOCUMENTS

| 6,486,008 B1 | 11/2002 | Lee |
| 2003/0183876 A1 | 10/2003 | Takafuji et al. |

(Continued)

FOREIGN PATENT DOCUMENTS

| EP | 1482548 A1 | 12/2004 |
| EP | 1970942 A1 | 9/2008 |

(Continued)

OTHER PUBLICATIONS

International Search Report corresponding to International Application No. PCT/JP2009/069208 mailed Feb. 16, 2010.

(Continued)

*Primary Examiner* — Calvin Choi
(74) *Attorney, Agent, or Firm* — Myers Bigel Sibley & Sajovec, P.A.

(57) ABSTRACT

There is provided a method for manufacturing an SOI substrate capable of effectively and efficiently embrittling an interface of an ion-implanted layer without causing the separation of a bonded surface 9 or the breakage of a bonded wafer.

Provided is a method for manufacturing an SOI substrate 8 by forming an SOI layer 4 on a surface of a transparent insulating substrate 3, the method comprising, in the following order, implanting ions into a silicon wafer 5 or a silicon wafer 5 with an oxide film 7 from a surface thereof so as to form an ion-implanted layer 2; subjecting at least one of the surface of the transparent insulating substrate and the surface of the ion-implanted silicon wafer or the silicon wafer with an oxide film to a surface activation treatment; bonding together the silicon wafer 5 or the silicon wafer 5 with an oxide film 7 and the transparent insulating substrate 3; subjecting the bonded wafer to a heat treatment at 150° C. or higher but not higher than 350° C. so as to obtain a laminate 6; and irradiating visible light at a side of the transparent insulating substrate 3 of the laminate 6 toward the ion-implanted layer 2 of the silicon wafer 5 or the silicon wafer 5 with an oxide film 7 to embrittle an interface of the ion-implanted layer 2 and transfer a silicon thin film to the transparent insulating substrate 3 so that the SOI layer 4 can be formed.

13 Claims, 3 Drawing Sheets

(56) References Cited

U.S. PATENT DOCUMENTS

| | | | |
|---|---|---|---|
| 2006/0113541 A1* | 6/2006 | Takemura | 257/59 |
| 2007/0063281 A1 | 3/2007 | Takafuji et al. | |
| 2008/0099066 A1* | 5/2008 | Ito et al. | 136/261 |
| 2008/0254595 A1* | 10/2008 | Kawai et al. | 438/458 |
| 2009/0029525 A1* | 1/2009 | Ohnuma | 438/458 |
| 2009/0061591 A1 | 3/2009 | Akiyama et al. | |
| 2009/0166896 A1* | 7/2009 | Yamazaki et al. | 257/787 |

FOREIGN PATENT DOCUMENTS

| | | |
|---|---|---|
| EP | 1986218 A1 | 10/2008 |
| JP | 2001-244444 | 9/2001 |
| JP | 2004-119636 | 4/2004 |
| JP | 2004-140266 | 5/2004 |
| JP | 2005-005699 | 1/2005 |
| JP | 2005-333042 | 12/2005 |
| JP | 2007-220900 | 8/2007 |

OTHER PUBLICATIONS

First Chinese Office Action corresponding to Chinese Application No. 200980144897.2 issued Jan. 29, 2013.

Supplementary European Search Report corresponding to European Application No. 09826104.3 issued Feb. 19, 2013.

* cited by examiner

METHOD FOR FABRICATING SOI SUBSTRATE

TECHNICAL FIELD

The present invention relates to a method for fabricating an SOI substrate using a transparent insulating substrate as a handle substrate.

BACKGROUND ART

Conventionally, there have been proposed SOI substrates referred to as Silicon on Quartz (SOQ), Silicon on Glass (SOG) and Silicon on Sapphire (SOS). These SOI substrates can be used as e.g. projectors, high-frequency devices due to the insulation properties and transparency of the handle substrate such as quartz, glass and sapphire.

Primarily, two methods are available for SOI manufacturing technology with regard to bonding.

One of the methods is an SOITEC method. A silicon substrate (donor substrate) into which hydrogen ions have been previously implanted at room temperature is attached to a substrate (handle substrate) serving as a supporting substrate. Subsequently, a bonded wafer is subjected to a heat treatment at high temperature (near 500° C.) to generate a multitude of microscopic gas bubbles called microcavities in an interface of an ion-implanted layer to cause delamination, thereby transferring a silicon thin film to the handle substrate.

The other method is referred to as a SiGen method. Both a surface of a silicon substrate into which hydrogen ions have also been previously implanted and a surface of a handle substrate are plasma-treated to activate surfaces, and then the plasma-treated surfaces are bonded together. Thereafter, the bonded wafer is mechanically delaminated at an interface of a hydrogen ion-implanted layer.

The SOITEC method has a drawback. Since the bonded wafer undergoes a high-temperature heat treatment after bonding, the bonded wafer may crack due to a large difference in thermal expansion coefficient when the silicon substrate is attached to the handle substrate such as quartz and sapphire substrates.

In the SiGen method, the bonded wafer has higher bonding strength compared with the SOITEC method at the time of bonding by surface activation treatment. However, a heat treatment at a temperature of 200° C. or higher is required to bond the substrates. As a result, there may arise such a problem that a bonded wafer breaks due to a difference in the coefficient of thermal expansion between the bonded substrates or untransferred portions are observed in a silicon thin film. This is because while the bonding strength of a bonded interface increases as temperature rises, separation may occur instead due to the warpage of the bonded wafer having different types of the substrates, and therefore, the bonding does not progress uniformly within a plane.

Note that the coefficient of thermal expansion of silicon is $2.6 \times 10^{-6}/K$, whereas the coefficients of thermal expansion of quartz and sapphire are $0.56 \times 10^{-6}/K$ and $5.8 \times 10^{-6}/K$, respectively. A difference in the coefficient of thermal expansion ($\Delta\alpha = \alpha(\text{donor}) - \alpha(\text{handle})$) in the case of SOQ is $\Delta\alpha = 2.04 \times 10^{-6}/K$ (compressive stress is applied to the silicon substrate), and $\Delta\alpha = -3.2 \times 10^{-6}/K$ (tensile stress is applied to the silicon substrate) in the case of SOS. Thus, the difference is extremely large. If these substrates are directly subjected to a high-temperature treatment after bonding, there arises the problem that the substrates crack or the bonded substrate separates off. Thus, the bonded substrate has the drawback that it is not possible to adopt the SOITEC method or the SiGen method widely used for conventional SOI substrates.

SUMMARY OF INVENTION

Problems to be Solved by the Invention

In view of the above situation, an object of the present invention is to provide a method for manufacturing an SOI substrate capable of effectively and efficiently embrittling an interface of an ion-implanted layer without causing the separation of a bonded wafer or the breakage of a substrate.

Means for Solving the Problems

The inventors of the present invention have formulated such a method of fabrication as described below, in order to solve the above-described problems.

That is, the present invention is A method for manufacturing an SOI substrate by forming an SOI layer on a surface of a transparent insulating substrate, the method comprising, in the following order, the steps of: implanting ions into a silicon wafer or a silicon wafer with an oxide film from a surface thereof so as to form an ion-implanted layer; subjecting at least one of the surface of the transparent insulating substrate and the surface of the ion-implanted silicon wafer or the silicon wafer with an oxide film to a surface activation treatment; bonding together the silicon wafer or the silicon wafer with an oxide film and the transparent insulating substrate; subjecting the bonded wafer to a heat treatment at 150° C. or higher but not higher than 350° C. so as to obtain a laminate; and irradiating visible light at a side of the transparent insulating substrate of the laminate toward the ion-implanted layer of the silicon wafer or the silicon wafer with an oxide film to embrittle an interface of the ion-implanted layer and transfer a silicon thin film to the transparent insulating substrate so that the SOI layer can be formed.

Effects of Invention

According to the present invention, an interface of an ion-implanted layer can be embrittled effectively and efficiently. Consequently, it is possible to prevent the breakage or crack of a bonded wafer, the separation of a bonded surface, and the like due to a difference in thermal expansion coefficient between a transparent insulating substrate and a silicon wafer.

EXPLANATION OF NUMERALS

Figure 1:
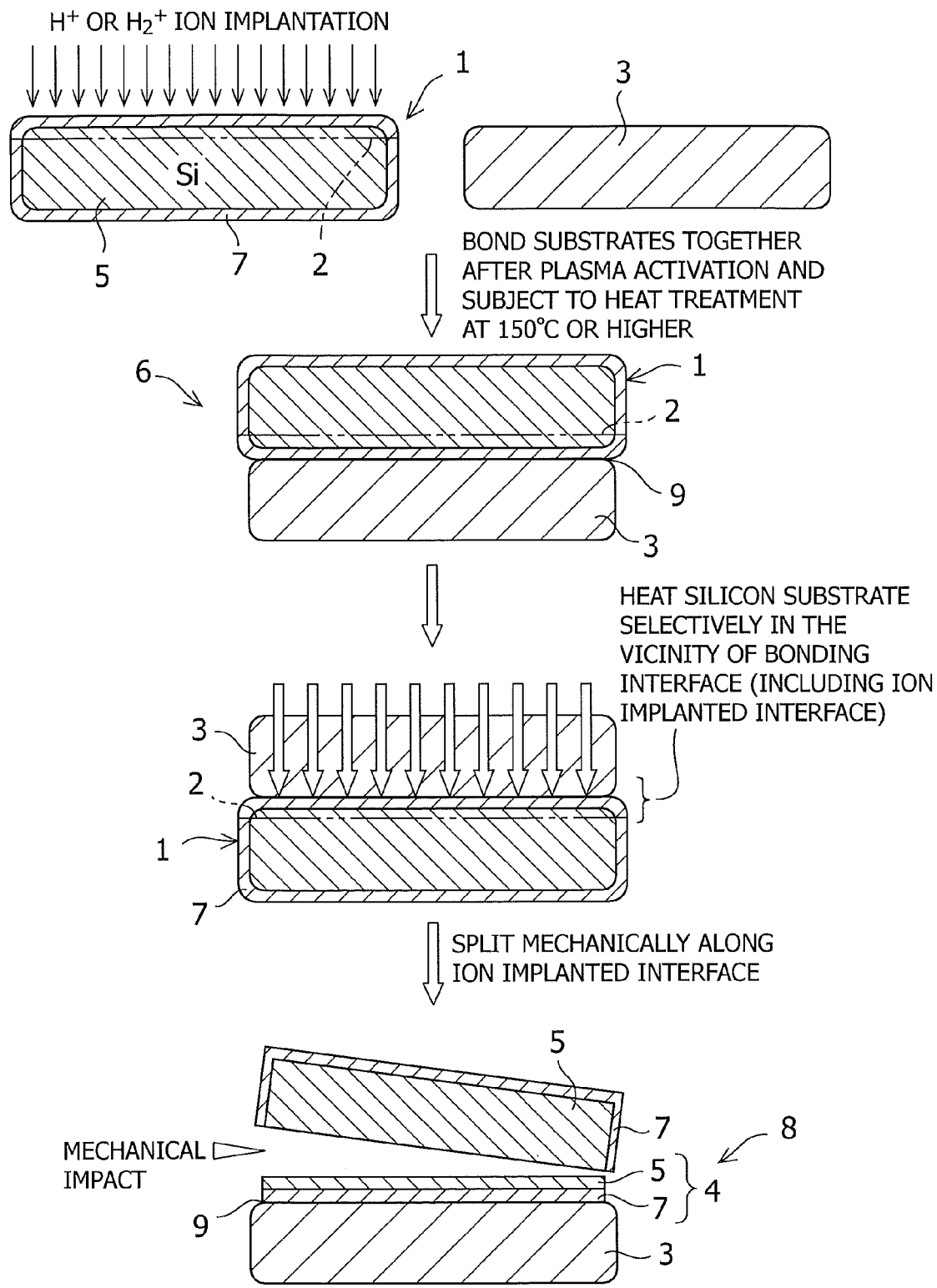
FIG. 1 is a schematic view illustrating one embodiment of a process for manufacturing an SOI substrate according to the present invention.

1 Silicon substrate (donor substrate)
2 Ion-implanted interface
3 Transparent insulating substrate (handle substrate)

4 SOI layer
5 Silicon wafer
6 Laminate
7 Oxide film
8 SOI substrate
9 Bonded interface

BEST MODES FOR CARRYING OUT THE INVENTION

Hereinafter, the present invention will be described in detail according to FIGS. 1 and 2.

First, ions are implanted into a silicon substrate or a silicon substrate 1 with an oxide film (hereinafter, simply referred to as the silicon wafer unless distinctly specified) to form an ion-implanted layer 2.

The ion-implanted layer 2 is formed inside the silicon wafer. At this time, a predetermined radiation dosage of hydrogen ions ($H^+$) or hydrogen-molecule ions ($H_2^+$) are implanted with an implantation energy capable of forming the ion-implanted layer at a desired depth from the front surface of the wafer. An implantation energy condition can be set to, for example, 50 to 100 keV.

The dose amount of hydrogen ions ($H^+$) to be implanted into the silicon wafer is preferably $1.0 \times 10^{16}$ atoms/cm$^2$ to $1.0 \times 10^{17}$ atoms/cm$^2$. If the dose amount is smaller than $1.0 \times 10^{16}$ atoms/cm$^2$, the embrittlement of an interface may not take place in some cases. If the dose amount exceeds $1.0 \times 10^{17}$ atoms/cm$^2$, the interface may turn into gas bubbles during heat treatment after bonding, thus resulting in transfer failure. A more preferred dose amount is $5.0 \times 10^{16}$ atoms/cm$^2$.

If hydrogen-molecule ions ($H_2^+$) are used as ions to be implanted, the dose amount thereof is preferably $5.0 \times 10^{15}$ atoms/cm$^2$ to $5.0 \times 10^{16}$ atoms/cm$^2$. If the dose amount is smaller than $5.0 \times 10^{15}$ atoms/cm$^2$, the embrittlement of an interface may not take place in some cases. If the dose amount exceeds $5.0 \times 10^{16}$ atoms/cm$^2$, the interface may turn into gas bubbles during heat treatment after bonding, thus resulting in transfer failure. A more preferred dose amount is $2.5 \times 10^{16}$ atoms/cm$^2$.

An insulating film, such as a silicon oxide film, approximately several nm to 500 nm in thickness, may be previously formed on a surface of the silicon wafer. Then, hydrogen ions or hydrogen-molecule ions may be implanted through the insulating film, thereby suppressing the channeling of implanted ions.

Next, a surface of the semiconductor substrate (silicon wafer 1) and/or a surface of the handle substrate (transparent insulating substrate 3) is subjected to an activation treatment.

Examples of a method of surface activation treatment include an ozone water treatment, a UV ozone treatment, an ion beam treatment, and a plasma treatment. The mechanism of the increase in bonding strength by surface activation has not yet been completely discovered but may be explained as follows: in the ozone water treatment, UV ozone treatment, and the like, activation is performed by decomposing the organic substance of a surface by ozone and thereby increasing OH groups in the surface. On the other hand, in the ion beam treatment, plasma treatment, and the like, activation is performed by exposing highly-reactive unbonded hands (dangling bonds) in a wafer surface or by attaching OH groups to the unbonded hands. Surface activation can be confirmed by observing the degree of hydrophilicity (wettability). Specifically, the degree of hydrophilicity can be simply and conveniently determined by dropping water on the wafer surface and measuring the contact angle of droplets of the water.

In the case of treatment with ozone water, the treatment can be achieved by immersing the wafer in pure water in which an approximately 10 mg/L of ozone is dissolved.

In the case of treatment with UV ozone, the treatment can be performed by irradiating UV light (for example, 185 nm) to an ozone gas or an ozone gas generated from the atmosphere.

In the case of treatment with an ion beam, bonding strength can be increased by treating the wafer surface with a beam of an inert gas, such as argon, under a high vacuum as in a sputter method and thereby exposing unbonded hands in the surface.

In the case of treatment with plasma, the semiconductor substrate and/or the handle substrate is placed within a vacuum chamber, a gas for plasma is introduced at a reduced pressure, and then the substrate or substrates are exposed to approximately 100 W of high-frequency plasma for about 5 to 10 seconds, thereby plasma-treating the substrate surface or surfaces. As the gas for plasma in a case where a semiconductor substrate is treated, oxygen-gas plasma can be used if a substrate surface is to be oxidized. If the substrate surface is not to be oxidized, it is possible to use a hydrogen gas, an argon gas, a mixed gas composed thereof, or a mixed gas composed of hydrogen and helium. Any of these gases may be used to treat the handle substrate.

By performing this treatment, organic substance in the surface of the semiconductor substrate and/or the surface of the handle substrate is oxidized and removed. In addition, OH groups in the surface increase, and therefore, the surface is activated.

Each of the above-described four types of treatment is preferably performed on both an ion-implanted surface of the semiconductor substrate and a bonded surface of the handle substrate, but may be performed only on either one of the surfaces.

A surface of the silicon wafer to be subjected to a surface activation treatment is preferably a surface into which ions have been implanted.

In the present invention, the thickness of the silicon wafer is not limited in particular. However, a silicon wafer having a regular thickness close to the SEMI/JEIDA standards is easy to deal with from the viewpoint of handling.

The transparent insulating substrate is desirably such that light in a visible light region (400 nm to 700 nm in wavelength) suffers only minimal energy loss before reaching an ion-implanted layer of a silicon wafer attached thereto. In addition, the transparent insulating substrate is not limited in particular, as long as the transmissivity thereof in the above-mentioned visible light region is 70% or higher. The substrate is preferably made of quartz, glass or sapphire, among other things, in that the substrate is superior in insulating property and transparency.

In the present invention, the thickness of the transparent insulating substrate is not limited in particular. However, a transparent insulating substrate having a regular thickness close to the SEMI/JEIDA standards is easy to deal with from the viewpoint of handling.

Next, a surface of this silicon wafer 1 and a surface of the transparent insulating substrate 3 subjected to an ozone water treatment, a UV ozone treatment, an ion beam treatment, a plasma treatment, or the like are bonded together as bonding faces.

Subsequently, the bonded substrate is subjected to a heat treatment at 150° C. or higher but not higher than 350° C. to obtain a laminate 6. The reason for performing the heat treatment is to prevent crystal defects from being introduced as the result that a bonding interface 9 becomes displaced due to a drastic temperature rise when it gets hot by post-process visible light irradiation. The reason for setting the temperature to 150° C. or higher but not higher than 350° C. is that bonding strength does not increase at temperatures below 150° C. and that the bonded wafer may break at temperatures above 350° C. Experiments and studies made by the inventors of the present invention showed that right temperature when the transparent insulating substrate was made of quartz or glass was 150° C. or higher but not higher than 350° C. and that right temperature was 150° C. or higher but not higher than 250° C. when the substrate was made of sapphire. These temperature regions may vary depending on the type of substrate.

Heat treating time is preferably 12 to 72 hours while it may depend on a certain degree on temperature.

Subsequently, the substrate is cooled down to room temperature. Visible light is irradiated from the transparent insulating substrate 3 side of the laminate 6 toward the ion-implanted layer 2 of the silicon wafer 5, thereby performing annealing on the substrate.

In the present specification, "visible light" refers to light having the maximum wavelength within the range of 400 to 700 nm. The visible light may be either coherent light or incoherent light.

FIG. 1 illustrates a case in which annealing is performed using laser light as an example of visible light. At this time, laser light passes through the transparent insulating substrate 3 and is absorbed almost not all. Thus, the laser light reaches the silicon substrate without heating the transparent insulating substrate. The laser light having thus reached the substrate selectively heats up only the vicinity of the bonded surface of silicon (including a bonding interface), particularly portions made amorphous by hydrogen ion implantation, thereby facilitating embrittlement of ion-implanted sites. The same holds true for annealing, such as RTA, using a halogen lamp as a light source or annealing using a Xe flash lamp having a peak wavelength near 500 nm.

In addition, the SOI substrate of the present invention has the characteristic that only a small portion of the silicon substrate (only the part of silicon in the vicinity of the bonding interface) is heated instantaneously, so as not to cause neither substrate cracks nor post-cooling warpage.

Figure 3:
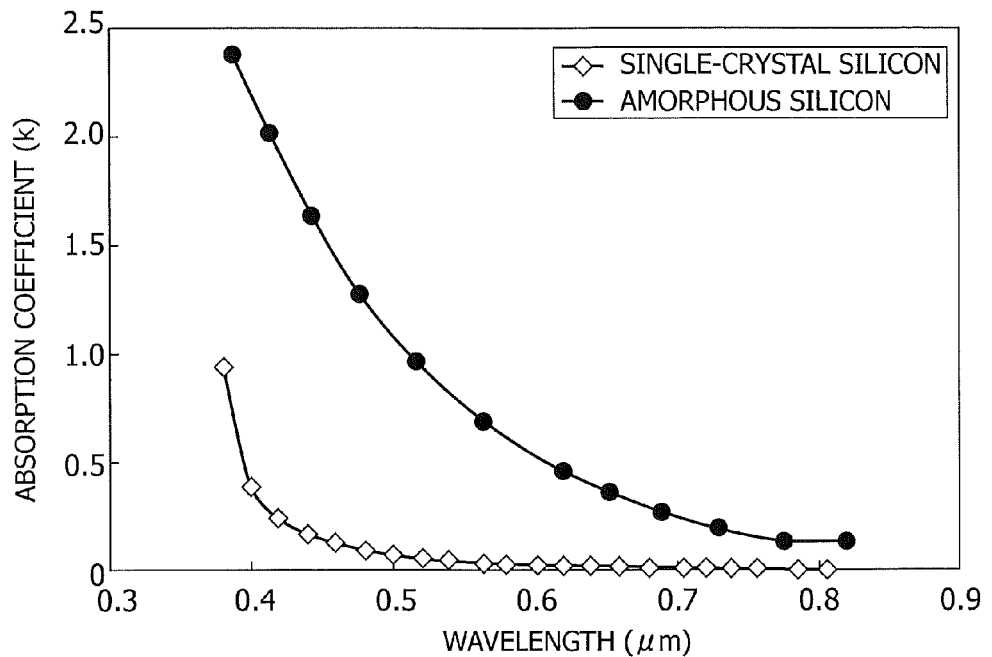
FIG. 3 is a graph illustrating wavelength-dependent spectrums of absorption coefficients of amorphous silicon and single-crystal silicon.
Figure 4:
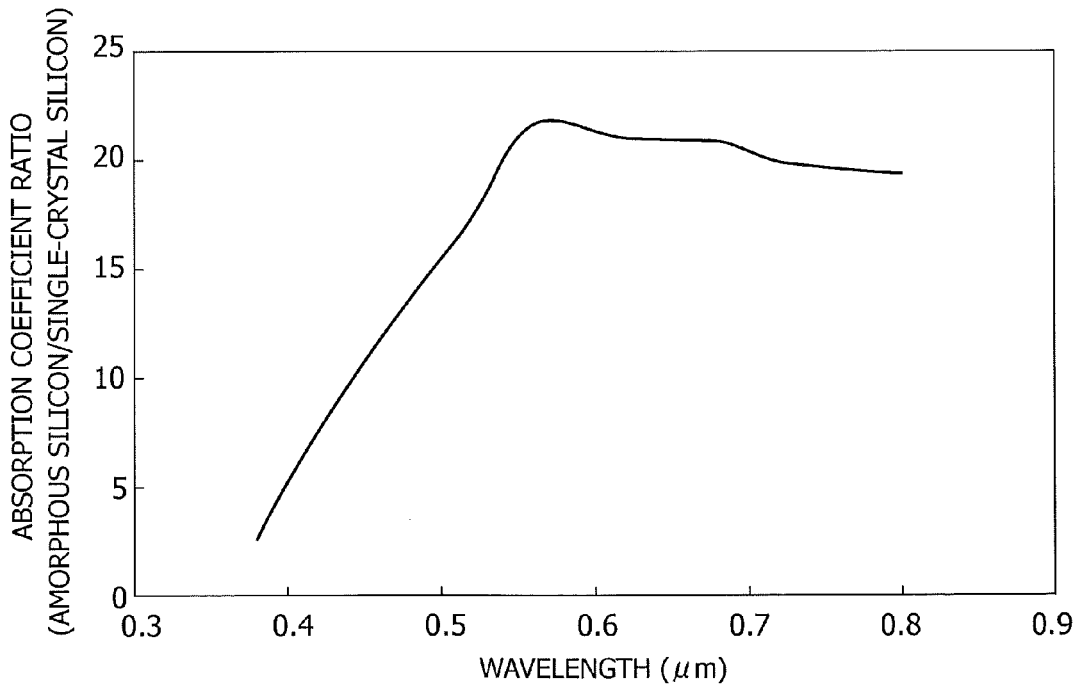
FIG. 4 is a graph illustrating a ratio between the absorption coefficients of amorphous silicon to single-crystal silicon (amorphous silicon/single-crystal silicon).

A laser wavelength to be used here is desirably a wavelength relatively easy to be absorbed by silicon (700 nm or shorter). In addition, the laser wavelength is desirably absorbed by amorphous silicon and is hard to be absorbed by single-crystal silicon portions, so that the portions made amorphous by hydrogen ion implantation can be selectively heated up. FIG. 3 shows absorption coefficients of amorphous silicon and single-crystal silicon. FIG. 4 shows a ratio between the absorption coefficients of amorphous silicon to single-crystal silicon (amorphous silicon/single-crystal silicon). Values used in these figures are excerpts from Edward D. Palik "Handbook of Optical Constants of Solids", Extended Abstracts of the 2001 International Conference on Solid State Devices and Materials, Tokyo, 2001, pp. 182-183. In view of FIGS. 3 and 4, it is understood that a suitable wavelength region is approximately 400 nm or longer but not longer than 700 nm, preferably 500 nm or longer but not longer than 600 nm, and more preferably 500 nm or longer but not longer than 550 nm. Examples of laser wavelengths corresponding to this wavelength band include the second harmonic wave (wavelength=532 nm) of a Nd:YAG laser and the second harmonic wave (wavelength=532 nm) of a $YVO_4$ laser, though not limited to these.

It should be noted that if the ion-implanted portions are overheated by laser irradiation, thermal delamination occurs in part, thus causing swell defects called blisters. These defects are visually observed from the transparent substrate side of the bonded wafer. Once delamination begins due to these blisters, local stress is applied to the bonded wafer, thus causing the bonded wafer to become broken. Accordingly, it may be important to irradiate laser light to the extent of not causing thermal delamination, and then perform mechanical delamination. Alternatively, it may be important to apply mechanical impact to a circumferential surface of the bonded wafer and in the vicinity of a bonded interface prior to laser irradiation, so that thermal shock by laser irradiation causes destruction of the ion-implanted interface across the entire surface of the bonded wafer from a starting point of the mechanical impact on the circumferential surface.

For laser irradiation conditions, it is empirically desirable that irradiation energy per unit area is 0.4 $J/cm^2$ to 1.6 $J/cm^2$ in cases where a laser having an oscillation frequency of 25 mJ@3 kHz at an output of 50 W to 100 W is used. The reasons for this are that if the irradiation energy is lower than 0.4 $J/cm^2$, embrittlement at the ion-implanted interface may not take place and that if the irradiation energy exceeds 1.6 $J/cm^2$, embrittlement is so intense that the substrate may break. Since irradiation is performed by scanning a spot of laser light over a wafer, it is difficult to specify the conditions by time. However, the irradiation energy after treatment desirably falls within the above-described range.

As a method of visible light irradiation, such a method as RTA used in a semiconductor process and the like is also useful. RTA allows for rapid temperature rise and fall as fast as 50 to 150° C./sec. Thus, RTA is an excellent method capable of finishing a process before heating up a substrate as a whole. At this time, it is important to heat only the vicinity of the ion-implanted interface to the extent of not causing thermal delamination. A heat source used in regular RTA is a halogen lamp, and therefore, suitable as a source of visible light irradiation.

Figure 2:
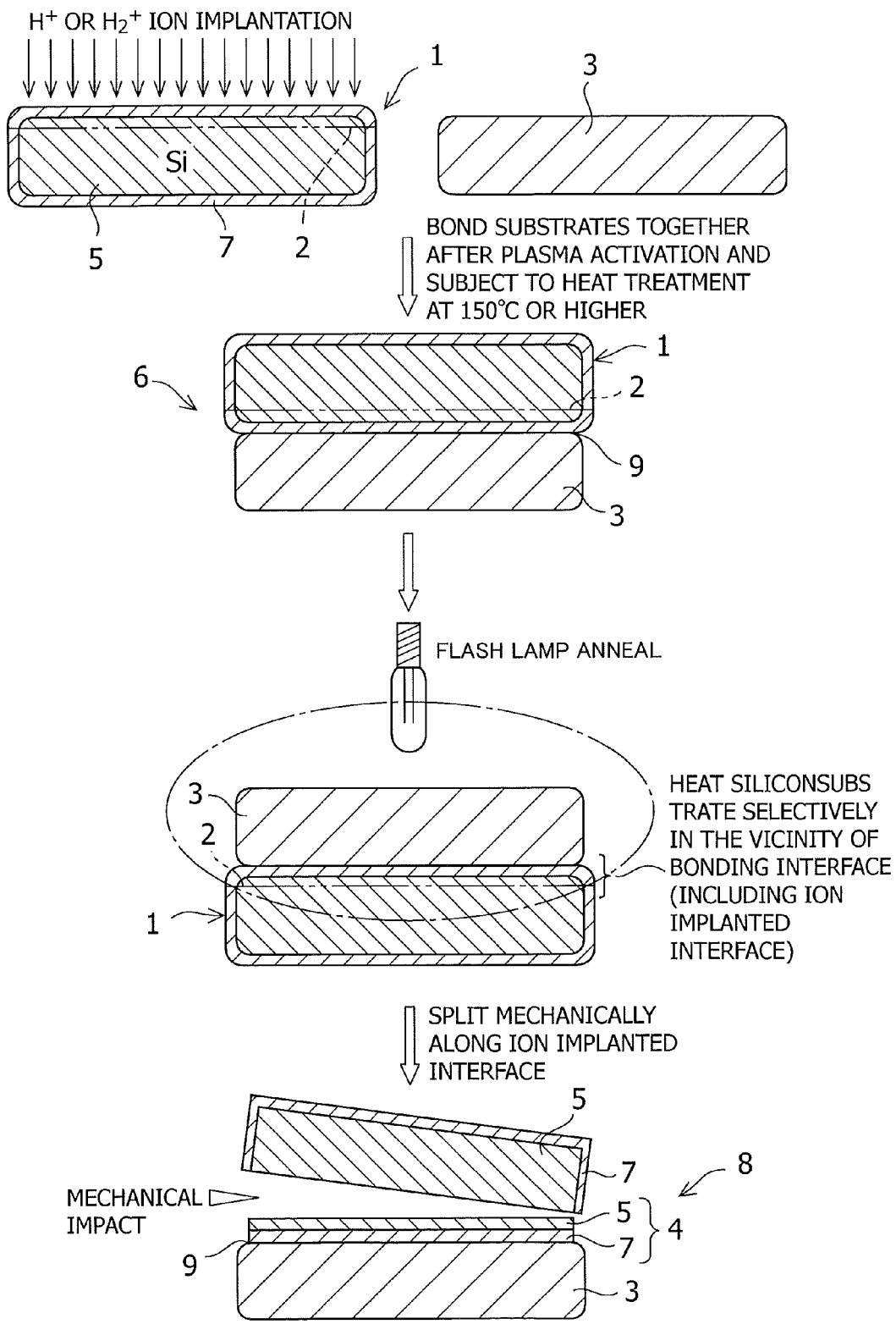
FIG. 2 is a schematic view illustrating another embodiment of the process for manufacturing the SOI substrate according to the present invention.

In addition, as illustrated in FIG. 2, it is possible to perform flash lamp-based anneal in substitution for the above-described laser anneal and RTA. A flash lamp used here unavoidably has a certain wavelength band so long as it is a lamp. However, the flash lamp desirably has peak intensity in a wavelength band from 400 nm or longer but not longer than 700 nm (wavelength band efficiently absorbed by silicon). The reasons for this are that even single-crystal silicon has a high absorption coefficient at wavelengths shorter than 400 nm and that even amorphous silicon becomes low in absorption coefficient at wavelengths longer than 700 nm. In view of FIGS. 3 and 4, it is understood that a suitable wavelength region is from 400 nm or longer but not longer than 700 nm. As a lamp light source corresponding to this wavelength band, a xenon lamp is generally used for heating. The peak intensity (at wavelengths not longer than 700 nm) of the xenon lamp exists near 500 nm and is, therefore, suited for the purpose of the present invention.

Note that if xenon lamp light is used, irradiation may be performed through a wavelength filter for cutting off light outside a visible-light band. In addition, a filter or the like having an absorption coefficient high for single-crystal silicon and adapted to shield against visible light of 450 nm or shorter is also effective in process stabilization. In order to suppress the occurrence of the abovementioned blisters, it is desirable to collectively irradiate the entire surface of the bonded wafer with this xenon lamp light. This collective irradiation makes it easy to prevent the stress localization of the bonded wafer and, thereby, prevent the breakage thereof. Accordingly, it may be important to irradiate xenon lamp light to the extent of not causing thermal delamination, and then perform mechanical delamination. Alternatively, it may be important to apply mechanical impact to a circumferential surface of the bonded wafer and to the vicinity of a bonded interface prior to the irradiation of xenon lamp light, so that thermal shock by the irradiation of xenon lamp light causes destruction of the ion-implanted interface across the entire surface of the bonded wafer from a starting point of mechanical impact on the circumferential surface.

If transfer of a silicon thin film to the transparent insulating substrate cannot be visually confirmed after laser light irradiation, RTA treatment, or flash lamp irradiation, thin-film transfer may be performed in which delamination is performed by applying mechanical impact to an interface of the ion-implanted layer, and the silicon thin film is transferred to the transparent insulating substrate.

In order to apply mechanical impact to the ion-implanted layer, a jet of a fluid, such as a gas, a liquid or the like, for example, may be continuously or intermittently blown from a lateral side of a bonded wafer, or a delamination instrument may be used. Methods for applying mechanical impact are not limited in particular, as long as mechanical delamination is caused by impact. The delamination instrument should be able to apply mechanical impact from a lateral side of the hydrogen ion-implanted layer of a laminate 6 heat-treated at a temperature of 150° C. or higher but not higher than 350° C. Preferably, the delamination instrument is sharp-pointed in a portion thereof placed against the lateral side of the hydrogen ion-implanted layer, and is movable along the ion-implanted layer. Also preferably, an acute-angled tool or a device having an acute-angled blade, such as scissors, is used. As the material of the device, it is possible to use plastic (for example, polyether ether ketone), zirconia, silicon, diamond, or the like. Metal or the like can also be used since no adherence is given to contamination. If contamination is a matter of concern, plastic may be used. Alternatively, a blade of scissors may be used as a wedge-shaped acute-angled tool.

With the above-described delamination process, there is obtained an SOI substrate 8 in which an SOI layer 4 is formed on a transparent insulating substrate 3.

Since the SOI substrate obtained by a method for manufacturing an SOI substrate according to the present invention is of such a type in which an SOI layer is formed on the transparent insulating substrate, the method is particularly suited for the fabrication of a substrate for use in electro-optic devices, such as a liquid crystal device.

EXAMPLE 1

Hydrogen ions were implanted into a silicon substrate (625 um in thickness), 150 mm in diameter, in which an oxide film had been previously grown to a thickness of 200 nm. An ozone water treatment, a UV ozone treatment, an ion beam treatment, and a plasma treatment were performed on surfaces of both the silicon substrate and a quartz substrate, thereby fabricating a total of four types of samples.

After a laminate was obtained by subjecting the bonded wafer to a heat treatment for 24-hour at 250° C., the laminate was irradiated with a green laser (532 nm in wavelength) from the transparent substrate side (quartz substrate side). By placing a wedge made of PEEK (polyether ether ketone) against a bonding interface and slightly applying mechanical impact after irradiation, a silicon thin film was transferred to the quartz substrate. The thickness of the silicon thin film thus transferred was 400 nm.

Visual observation of the four types of samples failed to find any defects in particular. Thus, the inventors confirmed that the four types of samples had the same quality level and that the quality level did not depend heavily on the type of surface activation.

EXAMPLE 2

Hydrogen ions were implanted into a silicon substrate (625 um in thickness), 150 mm in diameter, in which an oxide film had been previously grown to a thickness of 200 nm. An ion beam treatment was performed on surfaces of both the silicon substrate and a quartz substrate, thereby activating the surfaces. Thereafter, the two substrates were bonded together.

After a laminate was obtained by subjecting the bonded wafer to a heat treatment for 24-hour at 250° C., the laminate was irradiated with visible light by using a green laser (532 nm in wavelength), RTA, and a flash lamp from the transparent substrate side (quartz substrate side). Laser irradiation conditions at this time were specified as an output of 75 W and an oscillation frequency of 25 mJ@3 kHz. The entire surface of the substrate was irradiated so that irradiation energy was 1.2 J/cm$^2$.

In the case of RTA, a pyrometer was arranged so that the temperature of a bonding interface was observed with the pyrometer in a direction from the quartz substrate side. At this time, it is possible to also observe the temperature of the vicinity of the bonding interface. The bonded wafer was heated up to 350° C. (pyrometer reading) at a temperature rise rate of 50° C./sec. The power was cut off as soon as the temperature was reached, and the substrate was cooled.

In the case of the flash lamp, irradiation was performed with a pulse width set to 1 msec.

As in Example 1, a thin film of silicon was transferred to the quartz substrate by slightly applying mechanical impact to the bonding interface after irradiation. The thickness of the silicon thin film thus transferred was 400 nm. Visual observation of the three types of samples failed to find any defects in particular. Thus, the inventors confirmed that the three types of samples had the same quality level and that the quality level did not depend heavily on the above-described three types of irradiation.

EXAMPLE 3

Hydrogen ions were implanted into a silicon substrate (625 um in thickness), 150 mm in diameter, in which an oxide film had been previously grown to a thickness of 200 nm. An ion beam activation treatment was performed on surfaces of both the silicon substrate and a sapphire substrate, thereby activating the surfaces. Thereafter, the two substrates were bonded together.

After the substrates were heat-treated at 225° C. for 24 hours and bonded together, the bonded wafer was irradiated with a green laser (YVO$_4$ (SHG) laser), 532 nm in wavelength, from the sapphire substrate side. Laser irradiation conditions at this time were specified as an output of 75 W and an oscillation frequency of 25 mJ@3 kHz. The entire surface of the substrate was irradiated so that irradiation energy was 1.2 J/cm$^2$. Thereafter, mechanical impact was applied to a bonding interface to cause delamination, as in Examples 1 and 2, thereby transferring a silicon thin film to the sapphire substrate. Thus, the inventors confirmed the transfer of the silicon thin film to the entire surface of the sapphire substrate.

COMPARATIVE EXAMPLE 1

Hydrogen ions were implanted into a silicon substrate (625 um in thickness), 150 mm in diameter, in which an oxide film had been previously grown to a thickness of 200 nm. A UV ozone activation treatment was performed on surfaces of both the silicon substrate and a quartz substrate, thereby activating the surfaces. Thereafter, the two substrates were bonded together. At this time, the bonded substrate was irradiated with a green laser (YVO$_4$ (SHG) laser), 532 nm in wavelength, from the quartz substrate side, without performing any heat treatment. Laser irradiation conditions at this time were specified as an output of 75 W and an oscillation frequency of 5 mJ@3 kHz.

After the entire surface of the substrate was irradiated, mechanical impact was applied to a bonding interface to cause delamination, thereby transferring a silicon thin film to the quartz substrate. As the result of observing the transferred film by using an optical microscope, however, untransferred parts on the order of micrometers were found sporadically. This result proved that a post-bonding heat treatment was important.

EXAMPLE 4

Hydrogen ions were implanted into a silicon substrate (625 um in thickness), 150 mm in diameter, in which an oxide film had been previously grown to a thickness of 200 nm. A plasma activation treatment was performed on surfaces of both the silicon substrate and a sapphire substrate, thereby activating the surfaces. Thereafter, the two substrates were bonded together. After the substrates were heat-treated at 225° C. for 24 hours and bonded together, the bonded wafer was irradiated with a xenon flash lamp from the sapphire substrate side. Irradiation conditions at this time were specified as a pulse width of 1 msec. After the entire surface of the substrate was irradiated, mechanical impact was applied to a bonding interface to cause delamination, thereby transferring a silicon thin film to the sapphire substrate. Thus, the inventors confirmed the transfer of the silicon thin film to the entire surface of the substrate.

EXAMPLE 5

Hydrogen ions were implanted into a silicon substrate (625 um in thickness), 150 mm in diameter, in which an oxide film had been previously grown to a thickness of 200 nm. An ozone water activation treatment was performed on surfaces of both the silicon substrate and a sapphire substrate, thereby activating the surfaces. Thereafter, the two substrates were bonded together. The bonded wafer was heat-treated at 225° C. for 24 hours and was placed within an RTA apparatus. A pyrometer was arranged so that the temperature of a bonding interface was observed with the pyrometer in a direction from the sapphire substrate side.

At this time, it is possible to also observe the temperature of the vicinity of the bonding interface. The bonded wafer was kept at 250° C., and then heated up to 350° C. (pyrometer reading) at a temperature rise rate of 50° C./sec. The power was cut off as soon as the temperature was reached, and the substrate was cooled. After the entire surface of the substrate was irradiated, mechanical impact was applied to the bonding interface to cause delamination, thereby transferring a silicon thin film to the sapphire substrate. Thus, the inventors confirmed the transfer of the silicon thin film to the entire surface of the substrate.

EXAMPLE 6

Hydrogen ions were implanted into a silicon substrate (625 um in thickness), 150 mm in diameter, in which an oxide film had been previously grown to a thickness of 200 nm. A plasma activation treatment was performed on surfaces of both the silicon substrate and a quartz substrate, and the two substrates were bonded together. After the substrates were heat-treated at 225° C. for 24 hours and bonded together, the bonded wafer was irradiated with a xenon flash lamp from the quartz substrate side. Irradiation conditions at this time were specified as a pulse width of 1 msec. After the entire surface of the substrate was irradiated, mechanical impact was applied to the bonding interface to cause delamination, thereby transferring a silicon thin film to the quartz substrate. Thus, the inventors confirmed the transfer of the silicon thin film to the entire surface of the substrate.

The invention claimed is:

1. A method for manufacturing an SOI substrate by forming an SOI layer on a surface of a transparent insulating substrate, the method comprising, in the following order, the steps of:
   implanting ions into a silicon wafer or, a silicon wafer with an oxide film from a surface thereof so as to form an ion-implanted layer;
   subjecting at least one of the surface of the transparent insulating substrate and the surface of the ion-implanted silicon wafer or the silicon wafer with an oxide film to a surface activation treatment;
   bonding together the silicon wafer or the silicon wafer with an oxide film and the transparent insulating substrate;
   subjecting the bonded wafer to a heat treatment at 150° C. or higher but not higher than 350° C. so as to obtain a laminate; and
   irradiating visible light used for an RTA (Rapid Thermal Anneal) at a temperature of 150° C. or higher but not higher than 350° C. at a side of the transparent insulating substrate of the laminate toward the ion-implanted layer of the silicon wafer or the silicon wafer with an oxide film to embrittle an interface of the ion-implanted layer and transfer a silicon thin film to the transparent insulating substrate so that the SOI layer can be formed while avoiding thermal delamination.

2. The method for manufacturing an SOI substrate according to claim 1, wherein the surface activation treatment is one or more treatment selected from the group consisting of an ozone water treatment, a UV ozone treatment, an ion beam treatment, and a plasma treatment.

3. The method for manufacturing an SOI substrate according to claim 1, wherein mechanical impact is applied to a lateral side of the ion-implanted layer of the laminate at the time of transfer.

4. The method for manufacturing an SOI substrate according to claim 3, further comprising a step of applying mechanical impact to an interface of the ion-implanted layer after the visible light irradiation to split along the interface so that the SOI layer can be transferred onto the SOI substrate.

5. The method for manufacturing an SOI substrate according to claim 4, further comprising a step of applying mechanical impact to the vicinity of a bonding interface at an circumferential part of the laminate prior to the visible light irradiation.

6. The method for manufacturing an SOI substrate according to claim 1, wherein the visible light is laser light having a wavelength of 500 nm to 550 nm.

7. The method for manufacturing an SOI substrate according to claim 1, wherein the visible light is a second harmonic wave of a YVO$_4$ laser having a wavelength of 532 nm.

8. The method for manufacturing an SOI substrate according to claim 1, wherein the visible light is xenon flash lamp light.

9. The method for manufacturing an SOI substrate according to claim 1, wherein the transparent insulating substrate is made of glass, quartz or sapphire.

10. The method for manufacturing an SOI substrate according to claim 9, wherein the transparent insulating substrate is made of sapphire and the heat treatment temperature thereof is 150° C. or higher but not higher than 250° C.

11. The method for manufacturing an SOI substrate according to claim 9, wherein the transparent insulating substrate is made of glass or quartz and the heat treatment temperature thereof is 150° C. or higher but not higher than 350° C.

12. The method for manufacturing an SOI substrate according to claim 1, wherein the implanted ions are hydrogen atom ions ($H^+$) and the dose amount thereof is $1.0 \times 10^{16}$ atoms/cm$^2$ or larger but not larger than $1.0 \times 10^{17}$ atoms/cm$^2$.

13. The method for manufacturing an SOT substrate according to claim 1, wherein the implanted ions are hydrogen-molecule ions ($H_2^+$) and the dose amount thereof is $5.0 \times 10^{15}$ atoms/cm$^2$ or larger but not larger than $5.0 \times 10^{16}$ atoms/cm$^2$.

* * * * *

UNITED STATES PATENT AND TRADEMARK OFFICE
CERTIFICATE OF CORRECTION

| | | |
|---|---|---|
| PATENT NO. | : 8,563,401 B2 | Page 1 of 1 |
| APPLICATION NO. | : 13/127257 | |
| DATED | : October 22, 2013 | |
| INVENTOR(S) | : Akiyama et al. | |

It is certified that error appears in the above-identified patent and that said Letters Patent is hereby corrected as shown below:

On Title Page:
Item 57, Abstract, Lines 5-6:
Please correct "wafer.
        Provided is a method"
to read as one continuous paragraph as follows: -- wafer. Provided is a method --

In the Specification:
Column 1, line 4: Please insert the following section after the Title:
-- RELATED APPLICATIONS
This application is a 35 U.S.C. § 371 national stage application of PCT Application No. PCT/JP2009/069208, filed on November 11, 2009, which claims priority from Japanese Application No. 2009-256854 filed November 10, 2009 and Japanese Application No. 2008-290287 filed November 12, 2008, the contents of which are incorporated herein by reference in their entireties. The above-referenced PCT International Application was published as International Publication No. WO 2010/055857 A1 on May 20, 2010. --

In the Claims:
Column 10, Claim 1, Line 19: Please correct "silicon wafer or, a silicon wafer"
                                      to read -- silicon wafer or a silicon wafer --

Column 11, Claim 13, Line 17: Please correct "manufacturing an SOT substrate"
                                        to read -- manufacturing an SOI substrate --

Signed and Sealed this
Twenty-third Day of September, 2014

Michelle K. Lee
*Deputy Director of the United States Patent and Trademark Office*